(12) United States Patent
Otsuka et al.

(10) Patent No.: US 6,992,006 B2
(45) Date of Patent: Jan. 31, 2006

(54) METHOD FOR FABRICATING SEMICONDUCTOR DEVICE

(75) Inventors: Hideki Otsuka, Kyoto (JP); Tsuyoshi Miyata, Kyoto (JP); Muneyuki Matsumoto, Niigata (JP); Hiroshi Kawano, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/922,951

(22) Filed: Aug. 23, 2004

(65) Prior Publication Data

US 2005/0048777 A1  Mar. 3, 2005

(30) Foreign Application Priority Data

Aug. 27, 2003 (JP) .............................. 2003-302590

(51) Int. Cl.
*H01L 21/302* (2006.01)
*H01L 21/461* (2006.01)
(52) U.S. Cl. ....................................... 438/687; 438/692
(58) Field of Classification Search ................ 438/687, 438/691, 692, 745, 618, 622
See application file for complete search history.

(56) References Cited

U.S. PATENT DOCUMENTS

| | | | | |
|---|---|---|---|---|
| 4,659,793 A | * | 4/1987 | Yang | ............................ 526/91 |
| 6,423,148 B1 | * | 7/2002 | Aoki | ............................. 134/3 |
| 6,514,352 B2 | * | 2/2003 | Gotoh et al. | .................... 134/3 |
| 6,627,546 B2 | * | 9/2003 | Kneer | ......................... 438/687 |
| 6,787,480 B2 | * | 9/2004 | Aoki et al. | ................. 438/775 |
| 2002/0144710 A1 | * | 10/2002 | Aoki et al. | ..................... 134/3 |
| 2003/0087524 A1 | * | 5/2003 | Aoki et al. | ................. 438/691 |
| 2003/0168089 A1 | * | 9/2003 | Katakabe et al. | ........... 134/153 |
| 2003/0211814 A1 | * | 11/2003 | Shih et al. | ..................... 451/36 |
| 2004/0043611 A1 | * | 3/2004 | Stoeckgen et al. | .......... 438/687 |
| 2005/0090104 A1 | * | 4/2005 | Yang et al. | ................. 438/689 |

FOREIGN PATENT DOCUMENTS

JP  8-153698  8/1996

* cited by examiner

*Primary Examiner*—B. William Baumeister
*Assistant Examiner*—Igwe U. Anya
(74) *Attorney, Agent, or Firm*—McDermott Will & Emery LLP

(57) ABSTRACT

The present invention provides a method for fabricating a semiconductor device which initially performs chemical mechanical polishing with respect to a metal film made of copper formed on a semiconductor substrate to form wires composed of the metal film on the semiconductor substrate and subsequently removes a wire-to-wire bridge occurring during the formation of the wires and remaining on the semiconductor substrate to cause unneeded conduction between the wires adjacent to each other. The removal of the wire-to-wire bridge is performed by oxidizing the wire-to-wire bridge into a copper oxide by using an aqueous hydrogen peroxide and then dissolving the copper oxide by using an oxalic acid. This allows the removal of the wire-to-wire bridge without damaging the main bodies of the wires.

5 Claims, 7 Drawing Sheets

METHOD FOR FABRICATING SEMICONDUCTOR DEVICE

CROSS-REFERENCE TO RELATED APPLICATIONS

The teachings of Japanese Patent Application JP 2003-302590, filed Aug. 27, 2003, are entirely incorporated herein by reference, inclusive of the claims, specification, and drawings.

BACKGROUND OF THE INVENTION

The present invention relates to a method for fabricating a semiconductor device and, more particularly, to a method for forming copper wiring.

As the increasing miniaturization and higher performance of silicon semiconductor products are pursued in recent years, copper (Cu) wiring has been used on more frequent occasions. Since the dry etching of copper is extremely difficult, the formation of Cu wiring is performed typically by a sequence of process steps (damascene method) including a dry etching step performed with respect to an inter-wire insulating layer to form wire grooves, an electrolytic plating step for burying copper in the formed wiring grooves, and a chemical mechanical polishing (CMP) step for removing the excess portion of a Cu film and flattening the Cu film.

On the surface of a semiconductor substrate immediately after the CMP step, particles of a slurry and polished Cu dust and metal remain in a large quantity so that the cleaning of the substrate is performed to remove the residues. After the polishing, Cu wires are exposed at the surface of the substrate so that, if the removal of the residues is insufficient, it causes degraded wire performance and, especially, a short circuit between the wires. This presents a large problem to the performance of a semiconductor device.

For the cleaning of the semiconductor substrate after the CMP step, RCA cleaning has been used widely. A typical RCA cleaning sequence consists of the step of removing particles by using an alkaline solution (a solution mixture of ammonia and an aqueous hydrogen peroxide: APM), the step of removing an oxide film by using a dilute hydrofluoric acid, and the step of removing metal contamination by using an acid solution (a solution mixture of a hydrochloric acid and an aqueous hydrogen peroxide: HPM). If the RCA cleaning is performed with respect to Cu wires, however, the problem is encountered that the Cu wires are prone to etching because ammonia forms an ammine complex with Cu and the hydrofluoric acid roughens the surfaces of the Cu wires.

For a cleaning process after the formation of Cu wires, therefore, a method using a combination of mechanical cleaning employing a brush and chemical cleaning employing an organic acid (an oxalic acid) has been implemented normally. This is a method which removes particles by the mechanical effect of the brush and removes Cu contamination by forming a chelate complex of an oxalic acid with a copper oxide. In accordance with the cleaning method, however, it is difficult to remove a wire-to-wire bridge formed between Cu wires by polishing, though it is possible to remove extremely fine residues including particles and metal contamination to a degree. The mechanism of the occurrence of the wire-to-wire bridge in question will be described herein below with reference to FIG. 8 showing the geometries of the wire-to-wire bridges.

In the CMP step for a Cu film, the Cu film and a barrier film are polished and the polishing is ended when an inter-wire insulating layer 2 is exposed. To prevent an increase in wiring resistance resulting from a reduction in the film thickness of each of the Cu wires 6, polishing is performed such that the upper surface of the Cu wire 6 has a configuration protruding from the upper surface of the inter-wire insulating layer 2.

When pressure is exerted in a concentrated manner on the Cu wire 6 having such a protruding configuration during the polishing, the Cu wire 6 is crushed under the pressure to expand over the inter-wire insulating layer 2 so that a wire-to-wire bridge 9 is formed to provide conduction between the adjacent Cu wires 6, as shown in FIG. 8A.

When the Cu surface is shaved by a foreign substance during polishing and a scratch 21 is formed, the shaved Cu expands over the inter-wire insulating layer 2 so that a wire-to-wire bridge 9 as shown in FIG. 8B is formed. With polished Cu dust being buried in the scratched groove, a wire-to-wire bridge 9 as shown in FIG. 8C is formed.

The wire-to-wire bridge thus formed should be removed since it causes a short circuit between the wires and a reduction in the yield of a semiconductor product. In accordance with the conventional cleaning process using the brush and the oxalic acid, however, only extremely fine particles and metal contamination can be removed and such a wire-to-wire bridge cannot be removed.

On the other hand, there has been a cleaning process using ozonated water and a hydrofluoric acid as a cleaning method replacing the conventional RCA cleaning and the application of the cleaning process using ozonated water and a hydrofluoric acid to a Cu wiring step is proposed in, e.g., Japanese Laid-Open Patent Publication No. HEI 8-153698.

The cleaning method allows the removal of residues such as particles and metal on the substrate surface therefrom by oxidizing the Cu surface by using the ozonated water and removing a resulting oxidation layer by using the hydrofluoric acid. The cleaning method also allows even a wire-to-wire bridge composed of a Cu film to be removed to a degree.

As a result of closely examining the substrate surface after the process using the ozonated water and the hydrofluoric acid was performed by using an optical pattern defect inspection system, however, it was proved that 1000 or more depressed defects ranging in diameter from 100 nm to 300 nm were formed in the surfaces of Cu wires over the entire substrate surface.

FIG. 9 diagrammatically shows an outward appearance of a depressed defect 22 that has been observed. It can be considered that, since the oxidation-reduction potential of the ozonated water is as high as 1.1 V, Cu on the surface of each of the Cu wires 6 is ionized by the resulting battery effect and dissolved in the ozonated water, thereby causing such a depressed defect 22. When a large number of depressed defects 22 are formed in the surfaces of the Cu wires 6, there is the possibility that the wiring resistance increases to further cause a broken wire. As a result, the problem is encountered that it is extremely difficult to apply the cleaning process using the ozonated water and the hydrofluoric acid to a Cu wire forming step.

As a result of evaluating a wire-to-wire bridge removal rate achieved by the cleaning process using the ozonated water and the hydrofluoric acid by using an electronic pattern defect inspection system, it was also proved that the cleaning process using the ozonated water and the hydrofluoric acid only allowed the removal of about 75% of the wire-to-wire bridges.

SUMMARY OF THE INVENTION

In view of the foregoing problems, it is therefore an object of the present invention to allow the fabrication of a semiconductor device free of a short circuit or a broken wire by performing chemical mechanical polishing and then reliably removing residues and wire-to-wire bridges each made of copper without causing a depressed defect in the surfaces of copper wires.

To attain the object, in the method for fabricating a semiconductor device according to the present invention, a cleaning step for a semiconductor substrate after a chemical mechanical polishing step includes a step using an aqueous hydrogen peroxide and a step using an oxalic acid.

Specifically, a method for fabricating a semiconductor device according to the present invention comprises: a wiring step of performing chemical mechanical polishing with respect to a metal film made of copper formed on a semiconductor substrate to form wires each composed of the metal film on the semiconductor substrate; and a cleaning step of removing a wire-to-wire bridge occurring in the wiring step and remaining on the semiconductor substrate to cause unneeded conduction between the wires adjacent to each other, the cleaning step including: an oxidation step of oxidizing the wire-to-wire bridge by using an aqueous hydrogen peroxide to change the wire-to-wire bridge into a copper oxide; and an oxide removal step of removing the copper oxide by dissolving it by using an oxalic acid.

Since the method for fabricating a semiconductor device according to the present invention uses a hydrogen peroxide which is low in oxidation-reduction potential, the surface of each of the copper wires is prevented from being ionized and dissolved. This allows the wire-to-wire bridge made of copper to be oxidized into the copper oxide without causing a depressed defect in the surface of the copper wire. In addition, the copper oxide is removed by dissolving it by using the oxalic acid which dissolves therein only the copper oxide after the oxidation step so that the wire-to-wire bridge is removable without damaging the main body of the copper wire.

In the method for fabricating a semiconductor device according to the present invention, the cleaning step is preferably performed continuously in a single chamber. In the arrangement, the oxidation step and the oxide removal step are performed continuously in the same chamber. This obviates the necessity for inter-step transportation and achieves a reduction in process time.

Preferably, the method for fabricating a semiconductor device according to the present invention further comprises: prior to the cleaning step, a native oxide removal step of removing a native oxide formed on a surface of the wire-to-wire bridge by dissolving it by using an oxalic acid. The cleaning step may also include successively repeating the oxidation step and the oxide removal step twice or more times. The arrangement allows more reliable removal of a contaminant.

In the method for fabricating a semiconductor device according to the present invention, the aqueous hydrogen peroxide preferably has a concentration of not less than 0.1% and not more than 5%. The arrangement allows reliable oxidation of the contaminant such as the wire-to-wire bridge without causing a depressed defect in the surface of each of the copper wires.

In the method for fabricating a semiconductor device according to the present invention, the oxalic acid preferably has a concentration of not less than 0.01% and not more than 3%. The arrangement allows reliable removal of the copper oxide formed by the oxidation step.

BRIEF DESCRIPTION OF THE DRAWINGS

FIGS. 9A and 9B are views showing depressed defects in Cu wires, of which FIG. 9A is a plan view and FIG. 9B is a cross-sectional view taken along the line IXb—IXb of FIG. 9A.

DESCRIPTION OF THE PREFERRED EMBODIMENTS

Embodiment 1

Figure 1:
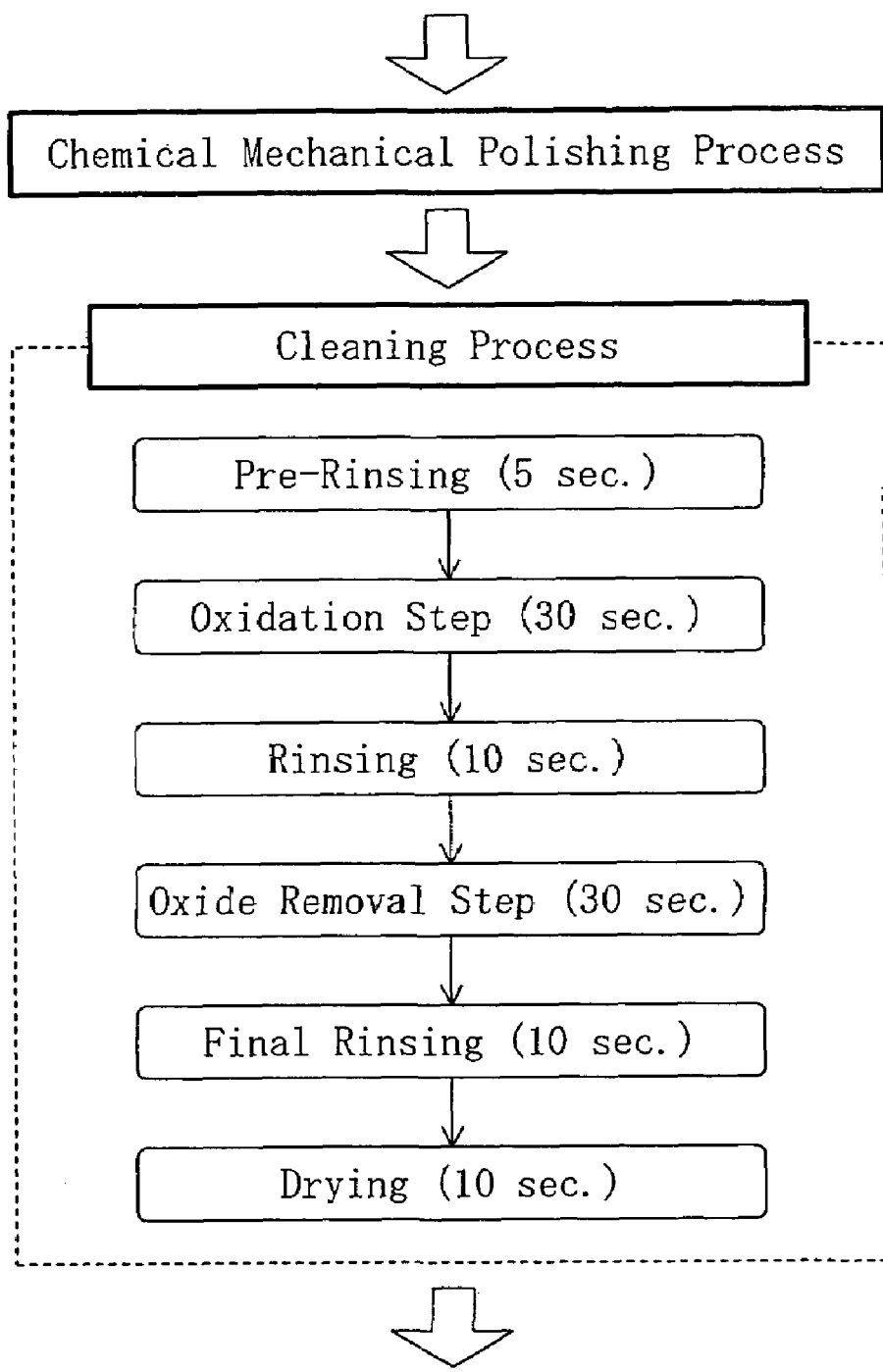
FIG. 1 is a flow chart showing a principal portion of a method for fabricating a semiconductor device according to a first embodiment.
Figure 2:
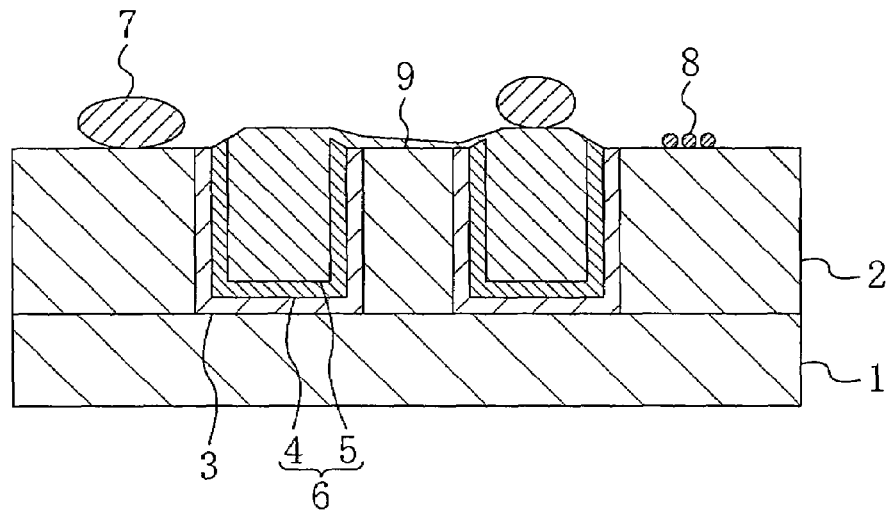
FIG. 2 is a cross-sectional view showing a semiconductor device prior to a cleaning process in the method for fabricating the semiconductor device according to the first embodiment.

FIG. 1 shows a process step flow in a method for fabricating a semiconductor device according to a first embodiment of the present invention. FIG. 2 shows a cross section of a semiconductor substrate immediately after a chemical mechanical polishing (CMP) process is ended. Herein below, a description will be given first to a method for forming copper (Cu) wires according to the present embodiment.

After forming wire grooves by performing dry etching with respect to an inter-wire insulating layer 2 formed on a semiconductor substrate 1, a barrier film 3 and a Cu seed film 4 are formed by sputtering and a Cu film 5 is further buried in the wire grooves by electrolytic plating. After an annealing process is performed with respect to the Cu film 5, the excess portion of the Cu film 5 formed on the inter-wire insulating layer 2 is removed by a CMP process, whereby Cu wires 6 as shown in FIG. 2 are formed.

As shown in FIG. 2, particles 7 of a slurry, polished Cu dust, and the like, residues of a metal contaminant 8 and the like, and a wire-to-wire bridge 9 providing conduction between the Cu wires 6 exist on the surface of the substrate immediately after the CMP process is ended, which should be removed. In particular, the wire-to-wire bridge 9 should be removed reliably because it causes a short circuit between the Cu wires 6 and therefore a reduction in the yield of a semiconductor product.

To remove the wire-to-wire bridge 9 and the residues, the present embodiment performs a cleaning process including an oxidation step using an aqueous hydrogen peroxide and an oxide removal step using an oxalic acid as shown in FIG. 1. The following is a detailed description of the cleaning process.

Figure 3A:
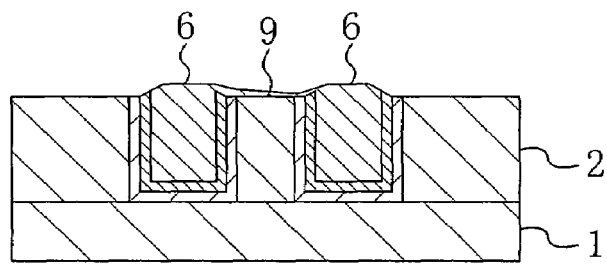
FIGS. 3A to 3C are cross-sectional views illustrating the individual process steps of a method for fabricating a semiconductor device according to the first embodiment.

FIG. 3 illustrate the states of cross sections in the individual steps according to the present embodiment. As shown in FIG. 3A, the wire-to-wire bridge 9 composed of a Cu thin film which causes a short circuit between the Cu wires 6 is formed on the inter-wire insulating layer 2 over the surface of the semiconductor substrate 1 prior to the cleaning process.

First, 5-second pre-rinsing using pure water is performed with respect to the semiconductor substrate 1 formed with the Cu wires 6 and the wire-to-wire bridge 9 to render the surface of the semiconductor substrate 1 hydrophilic. The pre-rinsing is performed by pouring the pure water at a flow rate of 1.0 L per minute onto the semiconductor substrate 1 being rotated at a speed of 500 rpm.

Figure 3B:
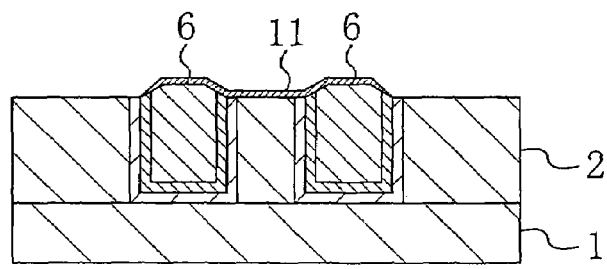

Next, oxidation is performed by pouring an aqueous hydrogen peroxide at a concentration of 1.0% and at a flow rate of 1.0 L per minute onto the semiconductor substrate 1 being rotated at a speed of 500 rpm so that a layer of a copper oxide ($CuO_x$: where x is a positive number) having a uniform thickness of 1 nm to 5 nm is formed by oxidizing the surfaces of the Cu wires 6 and the wire-to-wire bridge 9, as shown in FIG. 3B. Consequently, the wire-to-wire bridge 9 composed of a Cu thin film is entirely oxidized into a copper oxide.

Figure 3C:
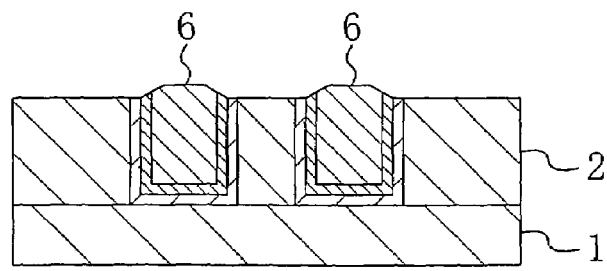

Next, rinsing using pure water is performed and then an oxalic acid solution at a concentration of 0.1% is poured at a flow rate of 1.0 L per minute for 30 seconds onto the semiconductor substrate 1 being rotated at a speed of 500 rpm in the oxide removal step, as shown in FIG. 3C. The oxalic acid does not form a complex with metal-bonded Cu but forms a chelate complex with the copper oxide so that the copper oxide layer is dissolved and removed successfully without damaging the unoxidized Cu surface. This allows the removal of the wire-to-wire bridge 9 that has been completely oxidized into the copper oxide without damaging the main body of each of the Cu wires 6.

Next, final rinsing using pure water is performed and the semiconductor substrate 1 is further rotated at a speed of 1500 rpm, whereby spin drying is performed.

Figure 4:
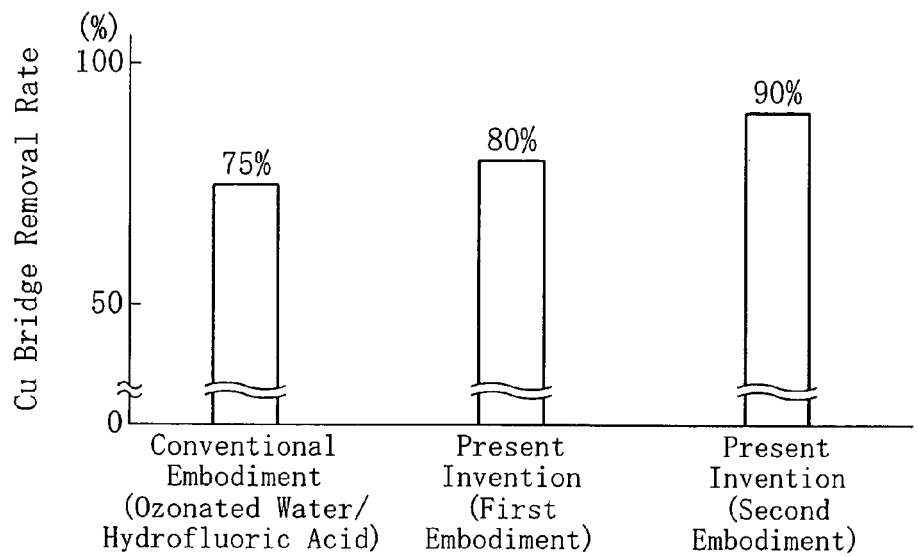
FIG. 4 is a graph showing a wire-to-wire bridge removal rate in the method for fabricating a semiconductor device according to the present invention.

By the foregoing cleaning process, the wire-to-wire bridge causing a short circuit between the wires can be removed efficiently. FIG. 4 shows a wire-to-wire bridge removal rate when the semiconductor device is fabricated by the cleaning process according to the present embodiment. In contrast to a removal rate of 75% in accordance with the conventional cleaning method which performs the oxidation using ozonated water and the removal of an oxide using a hydrofluoric acid, the removal rate is 80% in accordance with the cleaning method according to the present embodiment which performs the oxidation using the aqueous hydrogen peroxide and the removal of the oxide using the oxalic acid, so that the wire-to-wire bridge removal rate is satisfactory.

The wire-to-wire bridge removal rate was determined from the result of measuring the respective numbers of wire-to-wire bridges present on the surface of the semiconductor substrate before and after the cleaning process by using an electronic pattern defect inspection system.

In the present embodiment, the oxidation of Cu is performed by using the aqueous hydrogen peroxide. The oxidation-reduction potential of the aqueous hydrogen peroxide is about 0.3 V, which is lower than the oxidation-reduction potential of ozonated water (about 1.1 V), so that the Cu surface is oxidized successfully under mild conditions. This allows the formation of a copper oxide layer under a controlled state by preventing the formation of a depressed defect resulting from the ionization of Cu.

Since the removal of the oxide is performed by using the oxalic acid, not a hydrofluoric acid which reacts with unoxidized Cu, only a region oxidized into a copper oxide can be removed without causing any damage to the unoxidized Cu.

Figure 5:
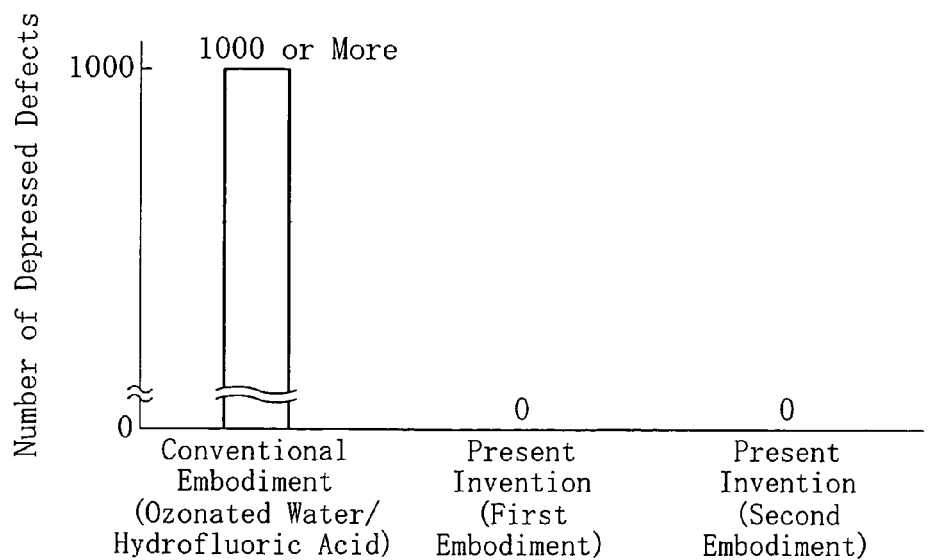
FIG. 5 is a graph showing the number of depressed defects formed in the method for fabricating a semiconductor device according to the present invention.

This allows the removal of the wire-to-wire bridge without damaging the main bodies of the Cu wires and therefore allows the fabrication of a semiconductor device free of a short circuit between wires and a broken wire. FIG. 5 shows the number of depressed defects in the surface of the semiconductor substrate determined by using an optical pattern defect inspection system. In contrast to 1000 or more depressed defects observed in accordance with the conventional method using the ozonated water and the hydrofluoric acid, a depressed defect was not observed in accordance with the method according to the present embodiment so that the Cu wires obviously incurred no damage.

Although the concentration of the aqueous hydrogen peroxide has been adjusted to 1% in the present embodiment, the concentration thereof may be adjusted appropriately within a range of not less than 0.1% and not more than 5% depending on the thickness of the wire-to-wire bridge to be removed or the like.

The concentration of the oxalic acid solution may be adjusted appropriately within a range of not less than 0.01% and not more than 3%. A foreign substance can be removed more effectively by also using a brush during the cleaning process using the oxalic acid.

Although the present embodiment has adjusted each of the time of the oxidation step and the time of the oxide removal step to 30 seconds, the times may be changed appropriately depending on a situation under which the wire-to-wire bridges are formed or the like.

By continuously performing the aqueous hydrogen peroxide process, the oxalic acid process, rinsing, and drying in the same chamber, inter-step transportation becomes unnecessary and the process time can be minimized.

By repeatedly performing the cleaning process, the wire-to-wire bridge removal rate can further be increased.

Embodiment 2

Referring to the drawings, a description will be given only to the difference between a method for fabricating a semiconductor device according to a second embodiment of the present invention and that according to the first embodiment.

Figure 6:
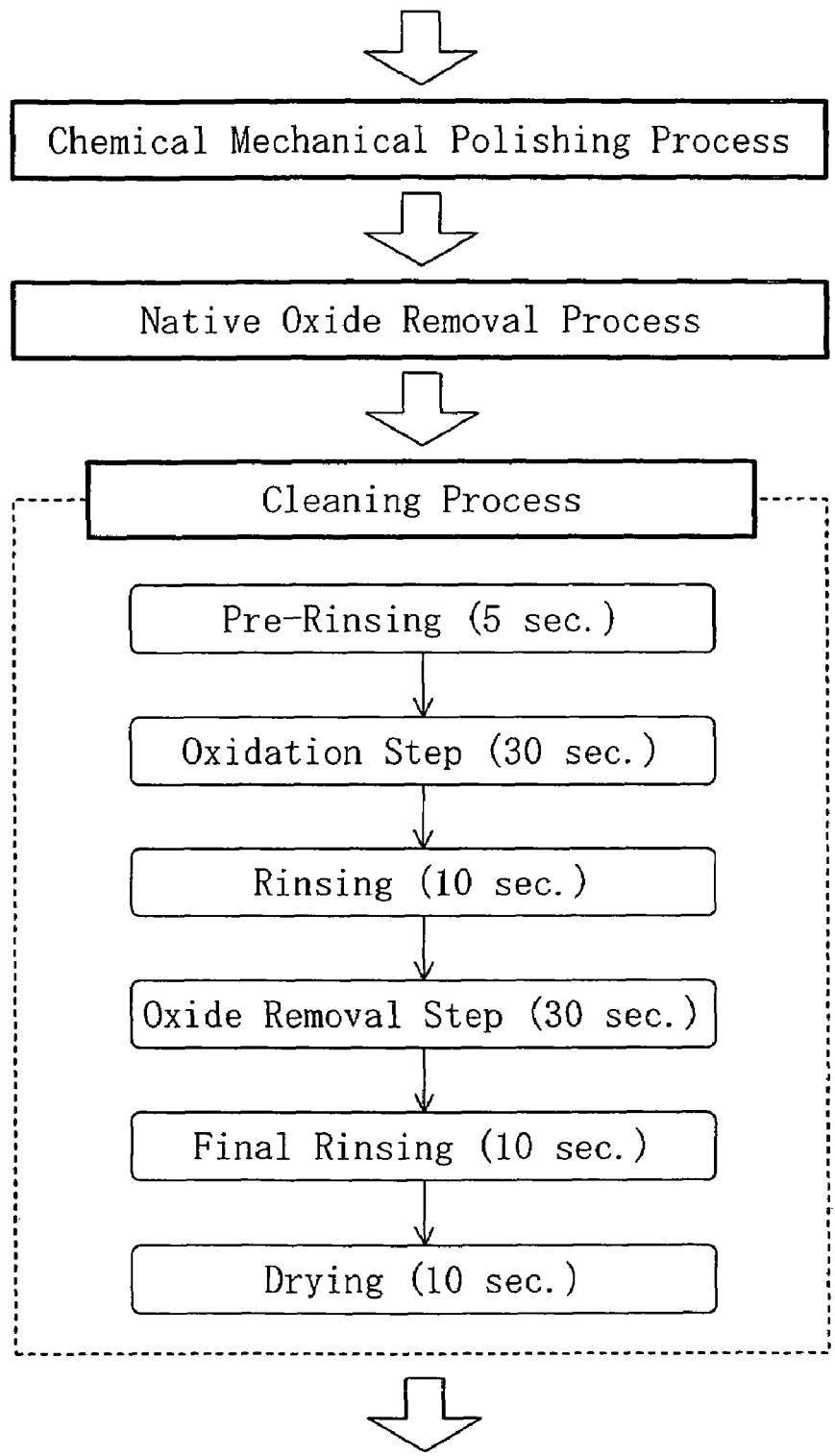
FIG. 6 is a flow chart illustrating a principal portion of a method for fabricating a semiconductor device according to a second embodiment.

FIG. 6 shows a process step flow in the method for fabricating a semiconductor device according to the second embodiment. As shown in FIG. 6, the present embodiment performs a native oxide removal process using an oxalic acid prior to the cleaning process.

FIGS. 7 illustrate the states of cross sections in the individual process steps according to the present embodiment. As shown in FIG. 7A, a layer of a copper oxide as a native oxide having a non-uniform thickness of 1 nm to 3 nm has been formed over the Cu wires 6 and the wire-to-wire bridge 9 after the CMP process.

Even if an oxidation step using an aqueous hydrogen peroxide is performed with respect to the Cu surface formed with such a native oxide, the oxidation of the Cu surface no more proceeds due to the oxide film that has been formed already. Accordingly, the unoxidized portion of the wire-towire bridge 9 remains even after the oxide removal step using the oxalic acid and causes a short circuit between the wires.

Figure 7A:
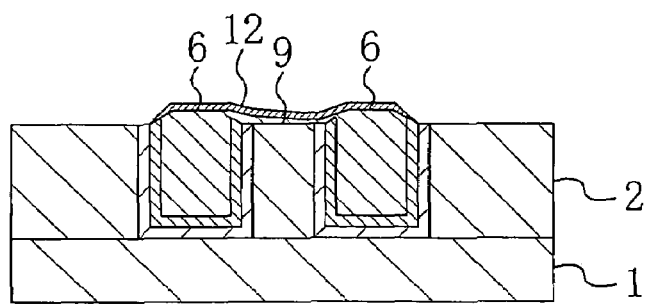
FIGS. 7A to 7D are cross-sectional views illustrating the individual process steps of the method for fabricating a semiconductor device according to the second embodiment.
Figure 7B:
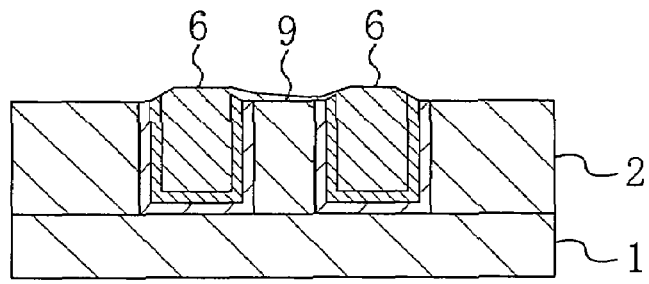

To prevent this, the present embodiment first performs the native oxide removal process using the oxalic acid prior to the cleaning process and thereby removes the native oxide formed on the surface of the wire-to-wire bridge 9, as shown in FIG. 7B. As a result, unoxidized Cu is exposed at the respective surfaces of the Cu wires 6 and the wire-to-wire bridge 9. The native oxide removal process is performed by performing pre-rinsing using pure water for 5 seconds to render the surface of the semiconductor substrate 1 hydrophilic and then pouring, at a flow rate of 1.0 L per minute for 30 seconds, an oxalic acid solution at a concentration of 0.01% onto the semiconductor substrate 1. At this time, the semiconductor substrate 1 is rotated at a speed of 500 rpm such that the oxalic acid solution is supplied to the entire surface of the semiconductor substrate 1.

Figure 7C:
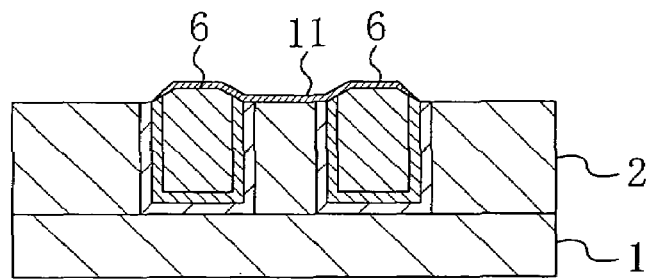

Subsequently, the semiconductor substrate 1 is treated with an aqueous hydrogen peroxide at a concentration of 1.0% for 30 seconds in the same manner as in the first embodiment so that a layer of a copper oxide film having a uniform thickness is formed by oxidizing the surfaces of the Cu wires 6 and the wire-to-wire bridge 9. This completely oxidizes the wire-to-wire bridge 9 into a copper oxide, as shown in FIG. 7C.

Figure 7D:
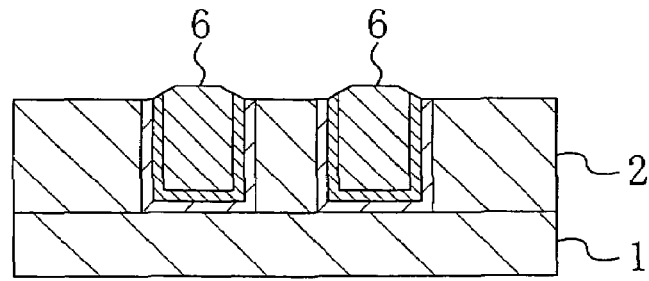
Figure 8A:
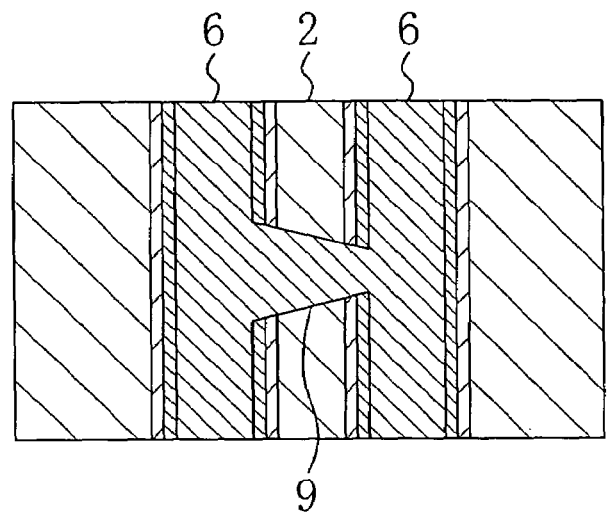
FIGS. 8A to 8C are plan views showing the geometries of wire-to-wire bridges.
Figure 8B:
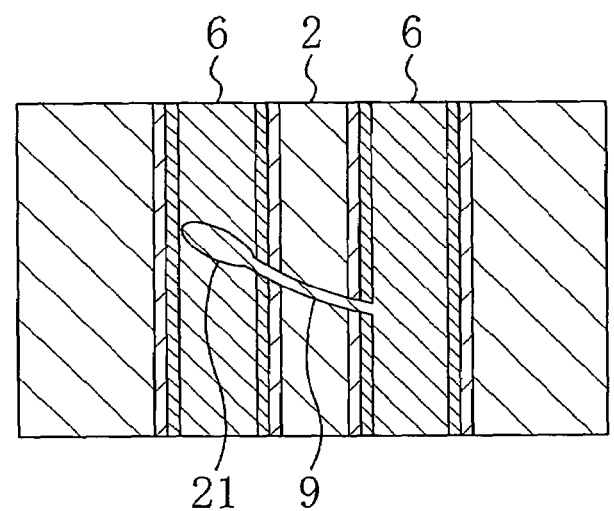
Figure 8C:
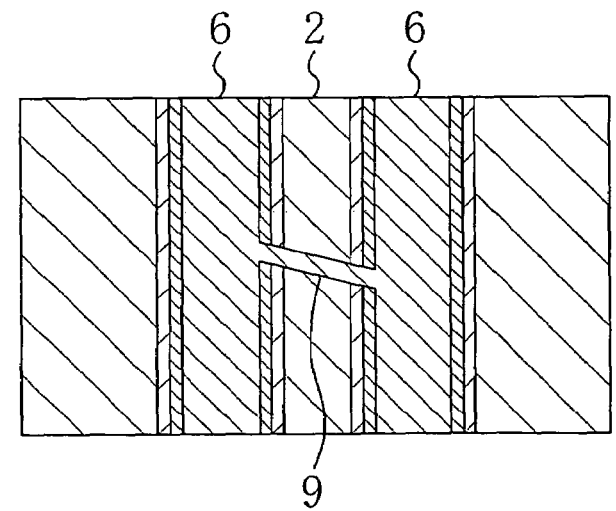
Figure 9A:
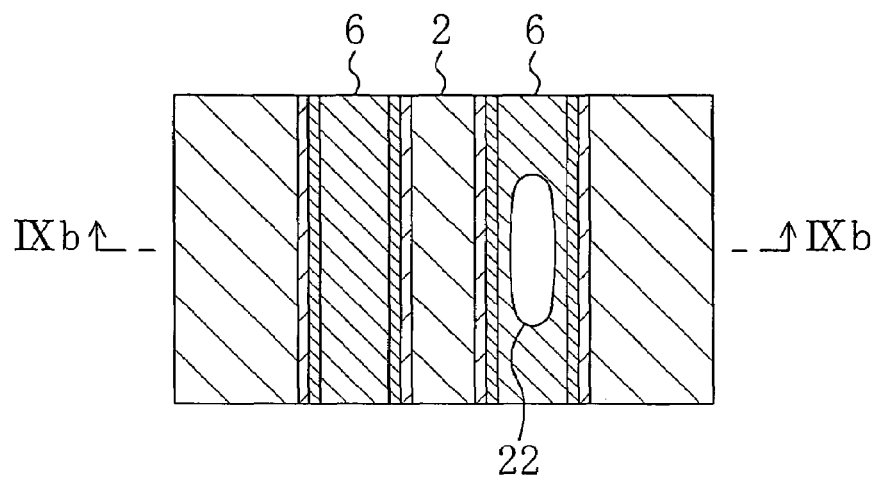
Figure 9B:
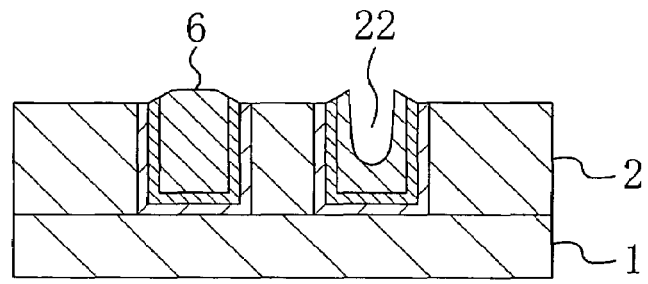

Next, as shown in FIG. 7D, the oxide removal step is performed by using an oxalic acid solution at a concentration of 0.01% for 30 seconds, thereby dissolving and removing the copper oxide from the semiconductor substrate 1. This completely removes the wire-to-wire bridge 9 formed in the CMP process and allows the fabrication of a semiconductor device free of a short circuit and a broken wire.

FIG. 4 shows the result of evaluating a wire-to-wire bridge removal rate in accordance with the method for fabricating a semiconductor device according to the present embodiment by using an electronic pattern defect inspection system in the same manner as in the first embodiment. As shown in FIG. 4, the obtained removal rate was 90%, which is hither than in the first embodiment. The reason for this may be that the removal of the native oxide performed first allows efficient oxidation of the wire-to-wire bridge performed subsequently by using the aqueous hydrogen peroxide.

FIG. 5 shows the result of evaluating the number of depressed defects by using an optical pattern defect inspection system in the same manner as in the first embodiment. According to the result, a depressed defect was not observed in the same manner as in the first embodiment.

Although the concentration of the hydrogen peroxide has been adjusted to 1% in the present embodiment, the concentration thereof may be adjusted appropriately within a range of not less than 0.1% and not more than 5% depending on the thickness of the wire-to-wire bridge to be removed or the like. The concentration of an oxalic acid solution may be adjusted appropriately within a range of not less than 0.01% and not more than 3%. A foreign substance can be removed more effectively by also using a brush during the cleaning process using the oxalic acid.

Although the present embodiment has adjusted each of the time of the native oxide removal process, the time of the oxidation step, and the oxide removal step to 30 seconds, the times may be changed appropriately depending on a situation under which the native oxide is formed, a situation under which the wire-to-wire bridge is formed, and the like.

By continuously performing the aqueous hydrogen peroxide process, the oxalic acid process, rinsing, and drying in the same chamber, inter-step transportation becomes unnecessary and the process time can be minimized.

By repeatedly performing the cleaning process, the wire-to-wire bridge removal rate can further be increased.

Since the method for fabricating a semiconductor device according to the present invention thus allows the fabrication of a semiconductor device free of a short circuit and a broken wire by reliably removing a contaminant such as a wire-to-wire bridge made of copper without causing a depressed defect in the surface of a copper wire after chemical mechanical polishing is performed, it is useful as a method for fabricating a semiconductor device, particularly as a method for forming copper wires.

What is claimed is:

1. A method for fabricating a semiconductor device, the method comprising:
   a wiring step of performing chemical mechanical polishing with respect to a metal film made of copper formed on a semiconductor substrate to form wires each composed of the metal film on the semiconductor substrate;
   a native oxide removal step of removing a native oxide by dissolving it by using an oxalic acid, the native oxide being formed on a surface of a wire-to-wire bridge occurring in the wiring step and remaining on the semiconductor substrate to cause unneeded conduction between the wires adjacent to each other, and
   after the native oxide removal step, a cleaning step of removing the wire-to-wire bridge, the cleaning step including:
   an oxidation step of oxidizing the wire-to-wire bridge by using an aqueous hydrogen peroxide to change the wire-to-wire bridge into a copper oxide; and
   an oxide removal step of removing the copper oxide by dissolving it by using an oxalic acid.

2. The method of claim 1, wherein the cleaning step is performed continuously in a single chamber.

3. The method of claim 1, wherein the cleaning step includes successively repeating the oxidation step and the oxide removal step twice or more times.

4. The method of claim 1, wherein the aqueous hydrogen peroxide has a concentration of not less than 0.1% and not more than 5%.

5. The method of claim 1, wherein the oxalic acid has a concentration of not less than 0.01% and not more than 3%.

* * * * *